US011104989B2

(12) United States Patent
Loeblein et al.

(10) Patent No.: US 11,104,989 B2
(45) Date of Patent: Aug. 31, 2021

(54) CHEMICAL VAPOR DEPOSITION PROCESS TO BUILD 3D FOAM-LIKE STRUCTURES (71) Applicant: Nanyang Technological University, Singapore (SG)

(72) Inventors: Manuela Loeblein, Singapore (SG); Siu Hon Tsang, Singapore (SG); Hang Tong Edwin Teo, Singapore (SG)

(73) Assignee: Nanyang Technological University, Singapore (SG)

(*) Notice: Subject to any disclaimer, the term of this patent is extended or adjusted under 35 U.S.C. 154(b) by 0 days.

(21) Appl. No.: 16/081,653

(22) PCT Filed: Mar. 9, 2017

(86) PCT No.: PCT/SG2017/050113
§ 371 (c)(1),
(2) Date: Aug. 31, 2018

(87) PCT Pub. No.: WO2017/155468
PCT Pub. Date: Sep. 14, 2017

(65) Prior Publication Data
US 2019/0093217 A1 Mar. 28, 2019

(30) Foreign Application Priority Data
Mar. 9, 2016 (SG) .......................... 10201601834U (51) Int. Cl.
*C23C 16/34* (2006.01)
*C01B 35/14* (2006.01)
(Continued)

(52) U.S. Cl.
CPC .......... *C23C 16/342* (2013.01); *C01B 32/186* (2017.08); *C01B 35/146* (2013.01);
(Continued)

(58) Field of Classification Search
CPC ...... C23C 16/01; C23C 16/342; C01B 32/174
See application file for complete search history.

(56) References Cited

U.S. PATENT DOCUMENTS 9,840,414 B2    12/2017  Zettl et al.
2013/0149447 A1*  6/2013  Mazyar ................... C23C 16/26
                                                            427/249.8
(Continued)

FOREIGN PATENT DOCUMENTS

CN    102126709 A    7/2011
CN    102674321 A    9/2012
(Continued)

OTHER PUBLICATIONS

International Search Report and Written Opinion for Application No. PCT/SG2017/050113 dated May 9, 2017, 10 pages.
(Continued)

*Primary Examiner* — Joseph A Miller, Jr.
(74) *Attorney, Agent, or Firm* — Alston & Bird LLP (57) ABSTRACT

A chemical vapor deposition process comprising heating a porous metal template at a temperature range of 500 to 2000° C.; and passing a gas mixture comprising a carrier gas carrying along a vapor of an organometallic compound and at least one of a carbon precursor gas and a boron nitride precursor gas through the heated metal template is provided. The heating temperature causes the decomposition of the organometallic compound vapor into metal particles, the carbon precursor gas into graphene domains, and/or the boron nitride precursor gas into hexagonal-boron nitride domains. The graphene domains and/or the hexagonal-boron nitride domains nucleate and grow on the metal particles and the metal template to form a three-dimensional interconnected porous network of graphene and/or the hexagonal-boron nitride. A foam-like structure produced by a process as described above is also provided. A foam-like structure as
(Continued)

described above for use in electrochemistry, solar cells, filler, thermal interface material, sensing or biological applications is further provided.

12 Claims, 5 Drawing Sheets

(51) Int. Cl.
| | |
|---|---|
| C23C 16/04 | (2006.01) |
| C23C 16/26 | (2006.01) |
| C01B 32/186 | (2017.01) |
| C23C 16/02 | (2006.01) |
| C23C 16/01 | (2006.01) |
| B82Y 40/00 | (2011.01) |

(52) U.S. Cl.
CPC .......... *C23C 16/01* (2013.01); *C23C 16/0227* (2013.01); *C23C 16/0281* (2013.01); *C23C 16/045* (2013.01); *C23C 16/26* (2013.01); *B82Y 40/00* (2013.01); *C01P 2002/30* (2013.01); *C01P 2004/03* (2013.01)

(56) References Cited

U.S. PATENT DOCUMENTS

| | | | | |
|---|---|---|---|---|
| 2015/0232343 | A1* | 8/2015 | Liu | .......... C23C 16/26 428/216 |
| 2017/0216923 | A1* | 8/2017 | Babenko | .............. B01J 35/0006 |

FOREIGN PATENT DOCUMENTS

| | | |
|---|---|---|
| CN | 103213980 A | 7/2013 |
| CN | 103232027 A | 8/2013 |
| CN | 104030282 A | 9/2014 |
| CN | 104053827 A | 9/2014 |
| CN | 104562195 A | 4/2015 |
| CN | 104807861 A | 7/2015 |
| IN | 2995CHE2010 A | 6/2015 |
| WO | WO 2015/040371 A2 | 3/2015 |
| WO | WO 2016/016660 A2 | 2/2016 |

OTHER PUBLICATIONS

Andrews, R. et al., *Continuous Production of Aligned Carbon Nanotubes: A Step Closer to Commercial Realization*, Chemical Physics Letters 303 (1999) 467-474.

Bi, H. et al., *Large-Scale Preparation of Highly Conductive Three Dimensional Graphene and Its Applications in CdTe Solar Cells*, J. Mater. Chem. 21 (2011) 17366-17370.

Cao, F. et al., *Fabrication and Characterization of Boron Nitride Bulk Foam From Borazine*, Materials and Designs 54 (2014) 610-615.

Cao, X. et al., *Preparation of Novel 3D Graphene Networks for Supercapacitor Applications*, Small 7, No. 22 (2011) 3163-3168.

Chen, W. et al., *In Situ Self-Assembly of Mild Chemical Reduction Graphene for Three-Dimensional Architectures*, Nanoscale 3 (2011) 3132-3137.

Chen, Z. et al., *Lightwieght and Flexible Graphene Foam Composites for High-Performance Electromagnetic Interference Shielding*, Adv. Mater. 25 (2013) 1296-1300.

Chen, Z. et al., *Three-Dimensional Flexible and Conductive Interconnected Graphene Networks Grown by Chemical Vapour Deposition*, Nature Materials, vol. 10 (Jun. 2011) 424-428.

Choi, B. G. et al., *3D Macroporous Graphene Frameworks for Supercapacitors With High Energy and Power Densities*, ACS Nano, vol. 6, No. 5 (2012) 4020-4028.

Crowder, S. W. et al., *Three-Dimensional Graphene Foams Promote Osteogenic Differentiation of Human Mesenchymal Steam Cells*, Nanoscale 5 (2013) 4171-4176.

Don, X-C. et al., *3D Graphene—Cobalt Oxide Electrode for High-Performance Supercapacitor and Enzymeless Glucose Detection*, ACS Nano, vol. 6, No. 4 (2012) 3206-3213.

Dong, Z. et al., *3D Graphene Foam as a Monolithic and Macroporous Carbon Electrode for Electrochemical Sensing*, ACS Appl. Mater. Interfaces 4 (2012) 3129-3133.

Gutierrez, M. C. et al., *Ice-Templated Materials: Sophisticated Structure Exhibiting Enhanced Functionalities Obtained After Unidirectional Freezing and Ice-Segregation-Induced Self-Assembly*, Chem. Mater. 20 (2008) 634-648.

Gutierrez, M. C. et al., *Poly(vinyl alcohol) Scaffolds With Tailored Morphologies for Drug Delivery and Controlled Release*, Adv. Funct. Mater. 17 (2007) 3505-3513.

Han, S. et al., *Porous Graphene Materials for Advanced Electrochemical Energy Storage and Conversion Devices*, Adv. Mater. 26 (2014) 849-864.

Huang, C. et al., *A Graphene Oxide/Hemoglobin Composite Hydrogel for Enzymatic Catalysis in Organic Solvents*, Chem. Commun. 47 (2011) 4962-4964.

Jia, J. et al., *Exceptional Electrical Conductivity and Fracture Resistance of 3D Interconnected Graphene Foam/Epoxy Composites*, ACS Nano, vol. 8, No. 6 (2014) 5774-5783.

Kim, M. J. et al., *Double-Walled Boron Nitride Nanotubes Grown by Floating Catalyst Chemical Vapor Deposition*, Nano Letters, vol. 8, No. 10, (2008) 3298-3302.

Kuang, J. et al., *A Hierarchically Structured Graphene Foam and Its Potential as a Large-Scale Strain-Gauge Sensor*, Nanoscale 5 (2013) 12171-12177.

Lee, Y. T. et al., *Temperature-Dependent Growth of Carbon Nanotubes by Pyrolysis of Ferrocene and Acetylene in the Range between 700 and 1000° C.*, Chemical Physics Letters 372 (2003) 853-859.

Lee, J-S. et al., *Three-Dimensional Nano-foam of Few-Layer Graphene Grown by CVD for DSSC*, Phys. Chem. Chem. Phys., vol. 14, No. 22 (Jun. 14, 2012) 7938-7943.

Lei, W. et al., *Porous Boron Nitride Nanosheets for Effective Water Cleaning*, Nature Communications 4:1777 (Apr. 30, 2013) 7 pages.

Li, X. et al., *Synthesis of 3D Hierarchical $Fe_3O_4$/Graphene Composites With High Lithium Storage Capacity and for Controlled Drug Delivery*, The Journal of Physical Chemistry, C 115 (2011) 21567-21573.

Li, N. et al., *Three-Dimensional Graphene Foam as a Biocompatible and Conductive Scaffold for Neural Stem Cells*, Scientific Reports, 3:1604 (Apr. 3, 2013) 1-6.

Loeblein, M. et al., *Configurable Three-Dimensional Boron Nitride-Carbon Architecture and Its Tunable Electronic Behavior With Stable Thermal Performances*, Small 10, No. 15 (2014) 2992-2999.

Loeblein, M. et al., *3D Graphene-Infused Polyimide With Enhanced for Long-Term Flexible Space Applications*, Small 11, No. 48 (2015) 6425-6434.

Maiti, U. N. et al., *Three-Dimensional Shape Engineered, Interfacial Gelation of Reduced Graphene Oxide for High Rate, Large Capacity Supercapacitors*, Adv. Mater. (2013) 1-5.

Maiyalagan, T. et al., *Electrodeposited Pt on Three-Dimensional Interconnected Graphene as a Free-Standing Electrode for Fuel Cell Application*, J. Mater. Chem. (Mar. 2012) 5 pages.

Nieto,k A. et al., *Three Dimensional Graphene Foam/Polymer Hybrid as a High Strength Biocompatible Scaffold*, Adv. Funct. Mater. 25 (2015) 3916-3924.

Niu, Z. et al., *A Leavening Strategy to Prepare Reduced Graphene Oxide Foams*, Adv. Mater. 24 (2012) 4144-4150.

Pettes, M. T. et al., *Thermal Transport in Three-Dimensional Foam Architectures of Few-Layer Graphene and Ultrathin Graphite*, Nano Lett. 12 (2012) 2959-2964.

Rouquerol, J. et al., *Recommendations for the Characterization of Porous Solids*, Pure & Appl. Chem., vol. 66, No. 8 (1994) 1739-1758.

Roy-Mayhew, J. D. et al., *Graphene Materials and Their Use in Dye-Sensitized Solar Cells*, Chem. Rev. 114 (2014) 6323-6348.

Sakhavand, N. et al., *Dimensional Crossover of Thermal Transport in Hybrid Boron Nitride Nanostructures*, Applied Materials & Interfaces, 7 (2015) 18312-18319.

(56) References Cited

OTHER PUBLICATIONS

Satishkumar, B. C. et al., *Bundles of Aligned Carbon Nanotubes Obtained by the Pyrolysis of Ferrocene-Hydrocarbon Mixtures: Role of the Metal Nanoparticles Produced In Situ*, Chemical Physics Letters 307 (1999) 158-162.
Sen, R. et al., *Carbon Nanotubes by the Metallocene Route*, Chemical Physics Letters 267 (1977) 276-280.
Song, Q. et al., *Anti-Inflammatory Effects of Three-Dimensional Graphene Foams Cultured With Microglial Cells*, Biomaterials 35 (2014) 6930-6940.
Song, Y. et al., *Ultralight Boron Nitride Aerogels via Template-Assisted Chemical Vapor Deposition*, Scientific Reports (May 15, 2015) 9 pages.
Sui, Z. et al., *Easy and Green Synthesis of Reduced Graphite Oxide-Based Hydrogels*, Carbon 49 (2011) 4314-4321.
Sun, L. et al., *From Coconut Shell to Porous Graphene-Like Nanosheets for High-Power supercapacitors*, J. Mater. Chem. A, 1 (2013) 6462-6470.
Tang, B. et al., *Three-Dimensional Graphene Network Assisted High Performance Dye Sensitized Solar Cells*, Journal of Power Sources 234 (2013) 60-68.
Vickery, J. L. et al., *Fabrication of Graphene-Polymer Nanocomposites With High-Order Three-Dimensional Architectures*, Adv. Mater. 21 (2009) 2180-2184.
Wang, H. et al., *3D Honeycomb-Like Structured Graphene and Its High Efficiency as a Counter-Electrode Catalyst for Dye-Sensitized Solar Cells*, Angew. Chem. 125 (2013) 9380-9384.
Wang, J.K. et al., *Polymer-Enriched 3D Graphene Foams for Biomedical Applications*, ACS Appl. Mater. Interfaces 7 (2015) 8275-8283.
Wang, W. et al., *Three Dimensional Few Layer Graphene and Carbon Nanotube Foam Architectures for High Fidelity Supercapacitors*, Nano Energy, 2 (2013) 294-303.
Wang, X. et al., *Three-Dimensional Strutted Graphene Grown by Substrate-Free Sugar Blowing for High-Power-Density Supercapacitors*, Nature Communications 4:2905 (Dec. 16, 2013) 8 pages.
Worsley, M. A. et al., *Synthesis of Graphene Aerogel With High Electrical Conductivity*, J. Am. Chem. Soc. 132 (2010) 14067-14069.

Su, D. et al., *Nanocomposites and Macroscopic Materials: Assembly of Chemically Modified Graphene Sheets*, Chem. Soc. Rev. 41 (2012) 6160-6177.
Wu, Z-S. et al., *Three Dimensional Graphene-Based Macro- and Mesoporous Frameworks for High-Performance Electrochemical Capacitive Energy Storage*, J. Am. Chem. Soc. 134 (2012) 19532-19535.
Wu, Z-S. et al., *Three-Dimensional Nitrogen and Boron Co-Doped Graphene for High-Performance All-Solid-State Supercapacitors*, Adv. Mater. 24 (2012) 5130-5135.
Xia, X. H. et al., *Three-Dimentional Porous Nano-Ni/Co(OH)$_2$ Nanoflake Composite Film: A Pseudocapacitive Material With Superior Performance*, J. Phys. Chem. C (Oct. 2017) pp. A-G.
Xiao, L. et al., *Self-Assisted Fe$_2$O$_3$/Graphene Aerogel With High Lithium Storage Performance*, ACS Appl. Mater. Interfaces, 5 (2013) 3764-3769.
Xu, Y. et al., *Three-Dimensional Self-Assembly of Graphene Oxide and DNA Into Multifunctional Hydrogels*, ACS Nano, vol. 4, No. 12 (2010) 7358-7362.
Xue, Y. et al., *Nitogen-Doped Graphene Foams as Metal-Free Counter Electrodes in High-Performance Dye-Sensitized Solar Cells*, Angew. Chem. Int. Ed. 51 (2012) 12124-12127.
Yavari, F. et al., *High Sensitivity Gas Detection Using a Macroscopic Three-Dimensional Graphene Foam Network*, Scientific Reports 1:166 (Nov. 23, 2011) 1-5.
Yin, J. et al., *Ultralight Three-dimensional Boron Nitride Foam With Ultralow Permittivity and Superelasticity*, Nano Lett. 13 (2013) 3232-3236.
Zhang, L. et al., *Porous 3D Graphene-Based Bulk Materials With Exceptional High Surface Area and Excellent Conductivity for Supercapacitors*, Scientific Reports 3:1408 (Mar. 11, 2013) 9 pages.
Zhang, X. et al., *Exceptional Thermal Interface Properties of a Three-Dimensional Graphene Foam*, Carbon 66 (2014) 201-209.
Zhou, M. et al., *Highly Conductive Porous Graphene/Ceramic Composites for Heat Transfer and Thermal Energy Storage*, Adv. Funct. Mater. 23 (2013) 2263-2269.
Zu, S-Z. et al., *Aqueous Dispersion of Graphene Sheets Stabilized by Pluronic Coploymers: Formation of Supramolecular Hydrogel*, J. Phys. Chem. C 113 (2009) 13651-13657.
Extended European Search Report for Application No. EP 17 76 3669 dated Oct. 16, 2019, 11 pages.
Office Action for Chinese Application No. 201780015454.8 dated Mar. 16, 2020, 22 pages.

\* cited by examiner

Template etching

Rinsing

Drying

CHEMICAL VAPOR DEPOSITION PROCESS TO BUILD 3D FOAM-LIKE STRUCTURES

CROSS-REFERENCE TO RELATED APPLICATION

This application is a national phase entry of PCT/SG2017/050113, filed on Mar. 9, 2017, which claims the benefit of priority of Singapore Patent Application No. 10201601834U, filed Mar. 9, 2016, the contents of which being hereby incorporated by reference in their entirety for all purposes.

TECHNICAL FIELD

The present disclosure refers generally to the field of chemical vapor deposition, in particular the process of depositing carbon and/or hexagonal boron nitride on a porous metal template to build 3D foam-like structures.

BACKGROUND

Recently, three-dimensional interconnected foam-like structures (3D-graphene, denoted by 3D-C, 3D-boron nitride denoted by 3D-BN, 3D-boron nitride carbon denoted by 3D-BNC) have attracted strong interest due to their high flexibility and high thermal and tunable electrical conductivity. Chemical vapor deposition (CVD) of these two dimensional materials (i.e. graphene, hexagonal (h) boron nitride, boron nitride carbon) on open celled reticulated metal foam is typically performed to synthesize 3D-C, 3D-BN and 3D-BNC, respectively. After etching the metal template, the 3D structure is preserved, which provides superior thermal transport properties both in the vertical and horizontal plane.

There are a few methods that had been reported to obtain foam-like graphene, h-BN and BNC structures. The first classification for these fabrication methods is the size of the pores they yield. This group of pores can be further subdivided into template-type used for fabrication:

Soft Template

Aerogels: in a typical soft-template approach, amphiphilic molecules (a chemical compound possessing both hydrophilic and lipophilic properties) and graphene can spontaneously assemble into hydrogels with 3D architectures. A sponge-like aerogel with highly cross-linked graphene sheets is obtained after removal of water via freeze-drying. A similar method was reported for BN aerogel.

Biomolecules such as DNA, hemoglobin (Hb), and vitamin C are also regarded as ideal components for co-assembly with graphene sheets to build up 3D macro-porous structures. The rich supramolecular chemistry of biomolecules enables the formation of aggregates with various morphologies. In addition, the multiple functional groups of biomolecules can interact with graphene sheets via hydrogen bonding, π-π, and ionic forces to stabilize the resultant networks with macro-pores.

Hard Template

In hard-template approaches, the deposition of graphene/BN layers on inorganic/organic particles larger than 50 nm or in-situ growth on metallic porous frameworks followed by the elimination of template can result in graphene/BN materials with macro-porous structures. In some cases, metallic frameworks such as nickel foams can be retained in the resulting composites and they can further serve as current collector when the composites are used as electrode materials in energy storage devices.

Freezing: rapid freezing of aqueous dispersions containing amphiphilic polymers such as PVA and chitosan (which are termed as ice-segregation-induced self-assembly, ISISA), has been employed to produce porous architectures with functional components. In this process, it was assumed that the ice crystals formed 3D structures with the presence of amphiphilic polymers which served as the hard templates.

Electro deposition: the charged nature of GO (graphene oxide) and its derivatives makes them alterable with electric fields, and therefore electro deposition can be employed for the fabrication of graphene-based macro-porous films.

Polymer template: microspheres of polymers such as polystyrene (PS) and polymethyl methacrylate (PMMA) can also serve as hard templates for the fabrication of macro-porous graphene materials.

Metal foam: porous nickel foam is a typical sacrificial template used for the in-situ growth of 3D graphene networks via a chemical vapor deposition (CVD) method, with ethanol or methane as the typical carbon source, which is also applicable for 3D-BN with sublimation of a powder as precursor, as well as for the so far only reported 3D-BNC structure.

Additionally, for (three-dimensional) BN aerogel the use of (three-dimensional) graphene aerogel as a template has been reported.

Template Free

The abundant oxygen-containing functional groups on the edges of graphene derivatives such as GO (graphene oxide) and RGO (reduced graphene oxide) provide active sites for the binding of inorganic nanoparticles or their precursors. These inorganic species in turn can serve as linkers for graphene sheets to build up 3D porous frameworks. Additionally, these inorganic components can introduce new functions into the resulting materials.

Gel-like structures: in-situ polymerization of suitable organic monomers in the presence of graphene sheets is a way to obtain graphene gels with 3D macro-porous structure.

Direct chemical reduction: it was found that direct chemical reduction of GO in water under atmospheric pressure with various reducing agents, (e.g. sodium hydrogen sulfite, sodium sulfide, vitamin C, hydrogen iodide) could also generate gel-like superstructures with 3D macro-porous features.

Filtration through membrane filter: the filtration of graphene/BN colloid through a membrane filter can generate free-standing paper-like or foil-like graphene/BN membranes, which can serve as precursors for the fabrication of porous graphene/BN paper.

Sugar-blowing: recently a report on blowing sugar to convert into a three-dimensional network of graphene was reported. The resultant network was called by the authors as "strutted graphene (SG)". This technique is grouped as substrate-less as a total conversion of the sugar is obtained and no remaining scaffold material must be removed.

Pyrolysis: for the case of 3D-BN a self-foaming phenomenon to create three-dimensional BN structures of polyborazine foams was reported.

In order to be able to fully control the final structure, a hard template method is the most prominent choice. The hard template allows exact determination of the final thickness, pore distribution and pore size of the foam. Among the hard templates presented, metal templates (i.e. nickel and copper) have been shown to deliver the most precise and repeatable structures. Additionally, these metals are common metals for two-dimensional CVD growth of graphene and h-BN and their growth mechanisms have been well studied.

Commonly encountered problems with the conventional template growth process is a premature termination of the deposition process due to saturation experienced once the metal template is fully covered with the carbon and/or boron nitride structure. Besides, the foams generally obtained via standard growth methods are very fragile, hard to handle and easy to tear apart. As such, they usually require a polymer coating (for example poly(methyl methacrylate) (PMMA)) for the removal step of the metal template, which introduces two additional synthetic steps (coating and cleaving of the polymer coating).

It is therefore an object of the present disclosure to provide a process which is not limited by the surface of the metal template and therefore is not terminated prematurely. It is a further object of the present disclosure to provide a process which results in stable and easy to handle 3D foam-like structures. It is an additional object of the present disclosure to provide a process which reduces the number of synthetic steps in order to provide the stable and easy to handle 3D foam-like structures.

SUMMARY

In a first aspect, the present disclosure refers to a chemical vapor deposition (CVD) process. The CVD process may include heating a porous metal template at a temperature range of 500 to 2000° C. The CVD process may further include passing a gas mixture comprising a carrier gas carrying along a vapor of an organometallic compound and at least one of a carbon precursor gas and a boron nitride precursor gas through the heated metal template. The heating temperature causes the decomposition of the organometallic compound vapor into metal particles, the carbon precursor gas into graphene domains, and/or the boron nitride precursor gas into hexagonal-boron nitride domains. Further, the graphene domains and/or the hexagonal-boron nitride domains nucleate and grow on the metal particles and the metal template to form a three-dimensional interconnected porous network of graphene and/or the hexagonal-boron nitride. Subsequent removal of the metal template releases the three-dimensional interconnected porous network of graphene and/or the hexagonal-boron nitride, thereby obtaining a 3D foam-like structure.

Advantageously, the process as detailed above comprises a gas mixture flow which simultaneously provides an organometallic compound vapor and a carbon and/or boron nitride precursor gas. By using this combination, the organometallic compound vapor decomposes during the deposition process and produces metal particles. These metal particles are then deposited together with carbon and/or boron nitride decomposed from the respective precursor gas and avoid a premature termination of the deposition process. The deposition of the carbon and/or boron nitride to form the 3D foam-like structure is therefore not dependent on the surface of the metal template. The termination of the deposition is only dependent on the provision of the gas mixture flow. By using this process, it is therefore possible to obtain denser, more stable and easier to handle foam-like structures.

Further advantageously, by obtaining denser, more stable and easier to handle foam-like structures, the process steps of coating the foam-like structure with a polymer coating for the step of removing the metal template and subsequent cleavage of the polymer coating can be avoided.

In other words, the metal activated vapor aided template growth process described here enables one to prolong the active growth-time, going beyond the usual saturation experienced once the metal foam template is fully covered. According to various embodiments of the disclosure, the thicker foams obtained allow easier handling and are more robust for further processing. Due to this, two steps during pre-processing of the foams (i.e. etching of the metal template after growth) can be skipped (polymer coating and polymer removal).

In a second aspect, the present disclosure refers to a foam-like structure produced by a process as described above.

In a third aspect, the present disclosure refers to a foam-like structure as described above for use in electrochemistry, solar cells, filler, thermal interface material, sensing or biological applications.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments are described with reference to the following drawings.

DESCRIPTION

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

3D foam-like structures have been developed according to various embodiments. The 3D foam-like structure according to the disclosure may comprise or substantially consist of graphene, hexagonal boron nitride or a mixture thereof (boron nitride carbon). The material for the formation of the 3D foam-like structures may be provided from a gas mixture flow in a chemical vapor deposition process. Additionally, the 3D foam-like structure according to the disclosure may contain a dopant, for example a metal particle. The 3D foam-like structure may nucleate (or grow) around (which includes on the surfaces and within the pores) a porous metal template and/or the metal particle. The focus of this disclosure is on macro-porous size.

Accordingly, in a first aspect, the present disclosure refers to a chemical vapor deposition (CVD) process. The CVD process may include heating a porous metal template at a temperature range of 500 to 2000° C. The CVD process may further include passing a gas mixture comprising a carrier gas carrying along a vapor of an organometallic compound and at least one of a carbon precursor gas and a boron nitride precursor gas through the heated metal template. The heating temperature causes the decomposition of the organometallic compound vapor into metal particles, the carbon precursor gas into graphene domains, and/or the boron nitride precursor gas into hexagonal-boron nitride domains. Further, the graphene domains and/or the hexagonal-boron nitride domains nucleate and grow on the metal particles and the metal template to form a three-dimensional interconnected porous network of graphene and/or the hexagonal-boron nitride. Subsequent removal of the metal template releases the three-dimensional interconnected porous network of graphene and/or the hexagonal-boron nitride, thereby obtaining a 3D foam-like structure.

The process proposed here improves common metal-based hard template methods by combining them with vapor-phase growth through sublimating an organometallic compound, for example metallocenes (which have a general formula of $(C_5H_5)_2M$, which are chemical compounds consisting of two cyclopentadienyl anions $(C_5H_5^-)$ bound to a metal center (M) in the oxidation state II, see chemical structure below). These metallocenes comprise further examples such as ferrocene, nickelocene, cobaltocene, ruthenocene, chromocene, osmocene. Besides enabling precise control on the structure morphology, they also hasten the growth and prevent the growth from saturating.

General chemical structure of metallocenes, which consists of two cyclopentadienyl anions $(C_5H_5^-)$ bound to a metal center (M) in the oxidation state II.

The deposition process may be undertaken in a chemical vapor deposition chamber. The chamber may comprise the porous metal template. Subsequently, the chamber may be heated up and serve as a furnace. Additionally, the chamber may be evacuated prior to the provision of the gas flow.

The term 'chemical vapor deposition' or "CVD" is to be interpreted broadly to include the infiltration and deposition of matter within the porous structure of a template, for example a metal template. As used herein, the matter may be provided in a gas flow. As used herein, the terminology understands the provision of a chamber comprising a gas inlet and a gas outlet. The term may include "chemical vapor infiltration (CVI)".

The term "metal template" in this application is to be interpreted broadly to describe a sacrificial template used for the in situ growth of 3D foam-like structures (or networks). The template may substantially consist of a metal or metalloid. The metal template according to the first aspect may serve as a seed for the deposition of the carbon and/or boron nitride. The porous nature of the template may serve as a "negative" for the deposition process. The metal template is porous in nature, i.e. it contains pores. The pores within the metal template may have a diameter larger than 50 nm, and therefore, according to the definition of the International Union of Pure and Applied Chemistry (IUPAC), the metal template is considered to be macro-porous. The walls defining the pores may have a thickness of about 0.5 nm to about 5 nm, or about 1.0 nm to about 4 nm, or about 1.5 nm to about 3 nm, or about 2 nm. The metal within the metal template may be selected from transition metals, preferably the transition metal may be selected from the groups X-XII, more preferably the transition metal may be selected from nickel and copper.

The term "gas flow" or "gas mixture flow" is to be interpreted broadly to include the provision of a single and a plurality of compounds in the gaseous phase, respectively. As used herein, it refers to a gas mixture flow comprising a carbon and/or boron nitride precursor gas and the vapor of the organometallic compound. The carbon and/or boron nitride precursor gas and the vapor of the organometallic compound are carried along by a carrier gas. The gas mixture flow may have a direction and may flow from a gas inlet within the vapor deposition chamber to a gas outlet. The gas mixture passes through the heated metal template. In other words, the gas mixture contacts the heated metal template. The contact points and areas may be the external or the internal surfaces of the metal template, i.e. on the exterior of the metal template or within the pores therein.

The term 'transition metal' is to be interpreted broadly to include any element in which the filling of the outermost shell to eight electrons within a periodic table is interrupted to bring the penultimate shell from 8 to 18 or 32 electrons. Transition elements may include, without limitation, scandium, titanium, vanadium, chromium, manganese, iron, cobalt, nickel, copper, zinc, ytterbium, zirconium, niobium, molybdenum, silver, lanthanum, hafnium, tantalum, tungsten, rhenium, rare-earth elements, cerium, praseodymium, neodymium, promethium, samarium, europium, gadolinium, terbium, dysprosium, holmium, erbium, thulium, yttrium, lutetium, and rhodium. Included in this definition are post-transition metals, which may refer to the metallic elements in the periodic table located between the transition metals (to their left) and the metalloids (to their right). These elements may include gallium, indium and thallium; tin and lead; and bismuth, cadmium and mercury; and aluminium.

As mentioned above, the components provided in the gas mixture may infiltrate the pores of the metal template and be deposited therein. After cooling of the metal template and the material deposited therein, the metal template may be removed, i.e. it is sacrificed. Accordingly, the 3D foam-like structure which remains may reflect the pores of the porous metal template.

In various embodiments, the heating of the metal template may be undertaken in the temperature range 500 to 2000° C., such as, 800 to 1500° C., preferably 900 to 1200° C. The heating may be undertaken in a CVD chamber and/or a furnace.

The term "organometallic compound" in present context is to be interpreted broadly to include any compound with a carbon-metal interaction. This interaction may be covalent or ionic. The interaction may be between a metal atom or a metalloid and a plurality of carbon atoms. The interaction may be between a metal atom and a plurality of carbon atoms which form an aromatic ring.

The organometallic compound may be provided in vapor phase. The organometallic compound may be sublimated to vapor in order to be used in the gas mixture, to serve as a vapor-phase substrate. Hence it is in the gas phase. Before sublimation, the organometallic compound may be provided neat in the solid phase. Alternatively, the organometallic compound may be provided as a solution in the liquid phase. Advantageously, by using a solution of the organometallic compound, a lower boiling point for vaporization is required. The organometallic compound may be selected from a metallocene. The metallocene may be selected from a transition metal metallocene belonging to the group VI to X. Hence, the metallocene may be selected from the group consisting of ferrocene, nickelocene, cobaltocene, ruthenocene, chromocene, osmocene.

The term 'vapor' or 'vaporized' is to be interpreted broadly to include a gaseous phase of the compound. As used herein, it refers to the gaseous phase of the organometallic compound.

Upon reaching the CVD chamber and the hot zone of the furnace therein, the organometallic compound vapor may decompose to form metal particles. Hence, the metal particles may be the reaction product from a decomposition reaction of the organometallic compound. The decomposition reaction may be heat induced, i.e. a pyrolysis. The metal particles may trigger additional deposition of foam-like structure onto already existing foam-like structure. Accordingly, the metal particle may serve as a seed for the deposition of additional carbon and/or boron nitride and thus, the formation of the 3D foam-like structure. In other words, the presence of an exposed metal is required for growth of the 3D foam-like structure. Without the presence of any available metal surface, the growth will saturate. Due to the presence of the metal from the organometallic compound, the growth of the 3D-foams can be extended due to the extra-surface of metal available.

The term 'metal particles' is to be interpreted broadly to include a plurality of metal atoms. These metal atoms may be in its elemental form. As used herein, the metal particle may be present within the 3D foam-like structure. There may be no covalent bond between the metal particle and the atoms of the 3D foam-like structure.

The term '3D foam-like structure' or '3D foam' is to be interpreted broadly to include a substantially solid, stable framework which is free-standing. The 3D foam-like structure may be porous. Accordingly, the foam may contain voids or hollow parts and it is understood that these do not form part of the solid foam, and they are accordingly excluded from the content of the foam, since they generally contain matter that differ from the foam as such. The porous foams may be classified by the size of the pores. They can be classified either as micro- and meso-porous or macro-porous. According to the definition of the International Union of Pure and Applied Chemistry (IUPAC), micro-pores are pores smaller than 2 nm in diameter, macro-pores are larger than 50 nm, meso-pores are defined as being in between. The 3D foam-like structure according to the disclosure may represent the "positive" when referred to in context with the metal template.

The carbon precursor gas may be selected from alkanes, alkenes and alcohols, up to a carbon chain of 4 carbon atoms. For example, the carbon source may be selected from methane, ethane, propane and butane. Additionally or alternatively, the carbon source may be selected from ethene, propene, 2-butene and 1,3-dibutene. Additionally or alternatively, the carbon source may be selected from methanol, ethanol, propanol, isopropanol and butanol. Preferably, the carbon source may be selected from methane, ethene, ethanol, or a combination thereof. The boron nitride precursor gas may be obtained from sublimated boron nitride powder.

The organometallic compound vapor may be supplied in the carbon and/or boron nitride precursor gas. In one embodiment, the gas flow of the carbon and/or boron nitride precursor gas may be at about 1-100 sccm, or about 1-80 sccm, or about 10-60 sccm, or about 15-50 sccm, or about 15-30 sccm, or about 20 sccm. The organometallic compound vapor within this flow may be provided from about 0.01-15 g, or from about 0.15-10 g, or from about 0.5-2 g, or at about 1 g of the sublimated organometallic compound. The above values may be varied depending on the CVD system used. They may also be upscaled or downscaled to be applicable for industrial applications. The gas flow may also be decreased once the growth time is extended.

In one example using the present CVD system, the gas flow of the carbon and/or boron nitride precursor gas may be at about 10-100 sccm, or about 10-80 sccm, or about 10-60 sccm, or about 15-50 sccm, or about 15-30 sccm, or about 20 sccm. The organometallic compound vapor within this flow may be provided from about 0.1-5 g, or from about 0.5-3 g, or from about 0.5-2 g, or at about 1 g of the sublimated organometallic compound. These values may be taken as an example only. Any variation on these values is within the scope of this application and within the capability of the person skilled in the art.

In various embodiments, the carrier gas may be selected from an inert gas, optionally selected from argon and/or nitrogen. Alternatively, the carrier gas may be hydrogen gas.

The term 'inert gas' is to be interpreted broadly to include any gas which does not form chemical bonds when used in chemical vapor deposition. Exemplary inert gases include noble gases but may include other gases so long as no chemical bonds are formed.

The carrier gas provides a stream which carries the carbon and/or boron nitride precursor gas and concurrently the organometallic compound vapor into the furnace, thereby resulting in decomposition of the organometallic compound vapor and pyrolysis of the carbon precursor gas and/or boron nitride precursor gas. Accordingly, the carbon and/or boron nitride precursor gas may decompose to form graphene and/or h-boron nitride on the structure. Hence, the structure formed may comprise the at least one metal particle from the organometallic compound and graphene and/or h-boron nitride. The graphene or h-BN domains may nucleate and grow simultaneously on both the metal template and the produced metal particles. In this step, the metal particles within the structure formed may accelerate the formation of additional structure. Advantageously, the growth of the structure may therefore be only limited by the supply of the gas flow containing the organometallic compound and the carbon and/or boron nitride source. In other words, the growth of the structure may not be limited by the surface area of the metal template. This advantage creates a foam with thicker walls, as compared to conventional methods.

During step c), the metal template may be placed such that it allows trapping of the metal particles derived from the organometallic compound.

After completion of the deposition step, the template together with the 3D foam-like structure may be cooled to room temperature.

Subsequently, the metal template may be removed by contacting the structure on the metal template with an acid. In various embodiments, the acid may be selected from a mineral acid, preferably selected from HCl and/or $HNO_3$.

The process as described above may comprise the additional step of washing the foam-like structure, optionally selected from washing the foam-like structure with water, preferably deionized water ($DI-H_2O$).

The process as described above may comprise the additional step of drying the foam-like structure, optionally selected from drying the foam-like structure at a temperature in the range of 100 to 1000° C., such as 200 to 800° C., preferably 300 to 700° C.

The foam-like structure produced according to the disclosure may be sufficiently dense and robust to avoid the need of a polymer coating step prior to any acid treatment. Hence, advantageously, the process as described above may proceed without a polymer coating step and the process as described above may proceed without a polymer removal step.

Figure 3:
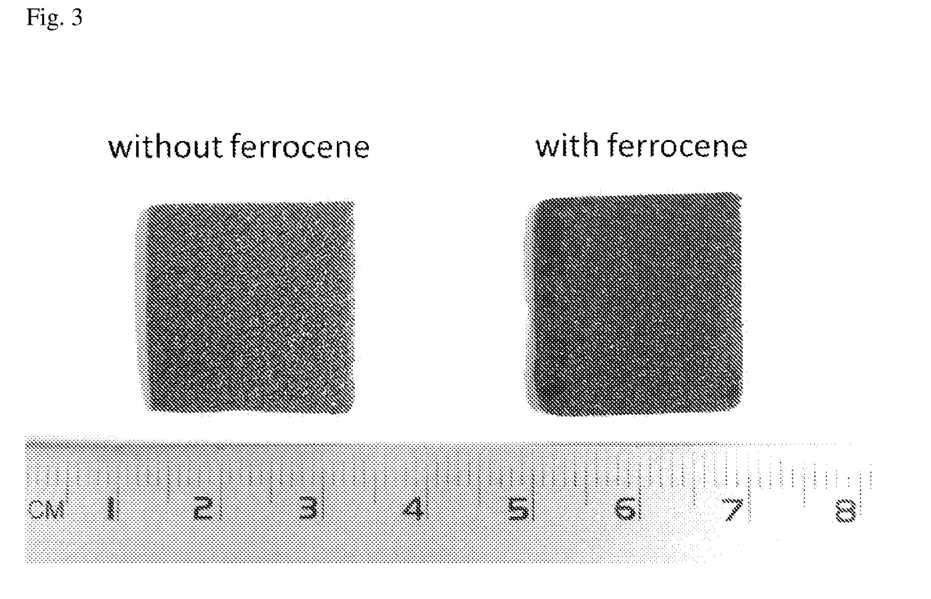
FIG. 3 provides a comparative example, wherein the optical images of two foam-like structures are shown. On the left side, the foam-like structure is produced without the use of an organometallic compound. On the right side, the foam-like structure is produced with an organometallic compound present during growth (exemplified as ferrocene).
Figure 4:
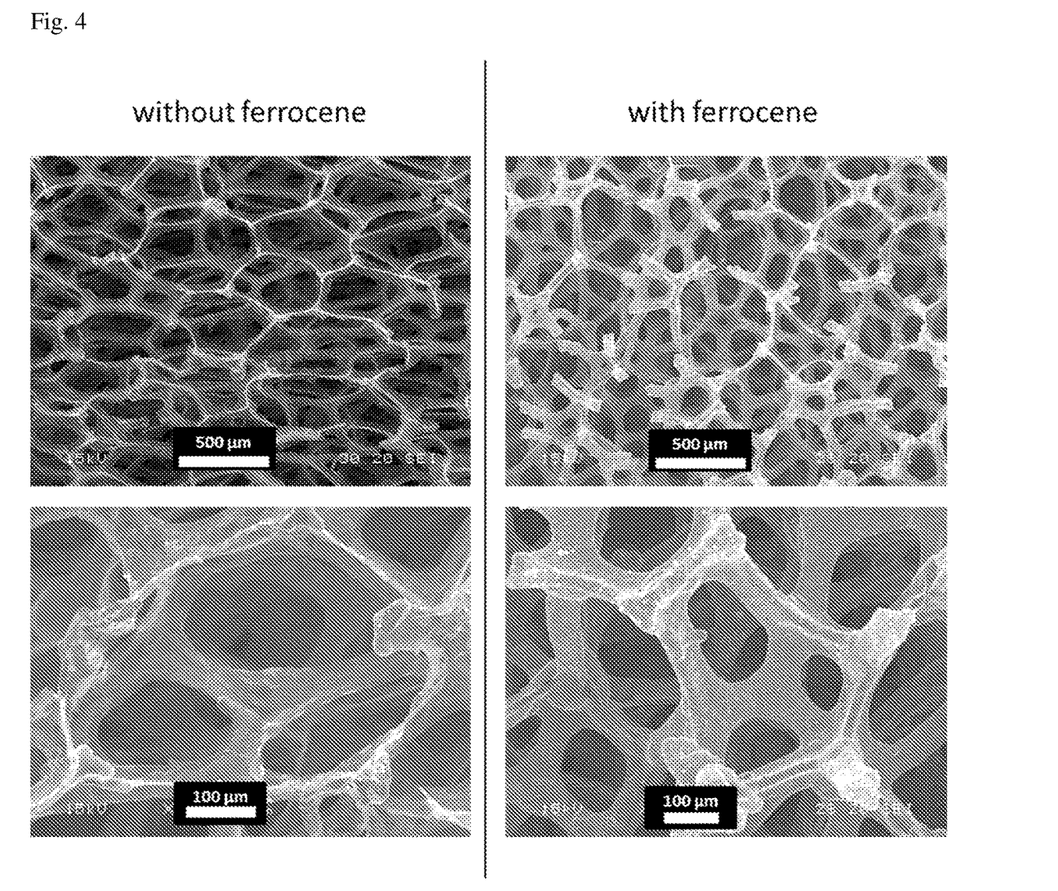
FIG. 4 provides a comparative example, wherein the scanning electron microscope (SEM) images of two foam-like structures are shown. On the left side, the foam-like structure is produced without the use of an organometallic compound. On the right side, the foam-like structure is produced with an organometallic compound present during growth (exemplified as ferrocene).
Figure 5:
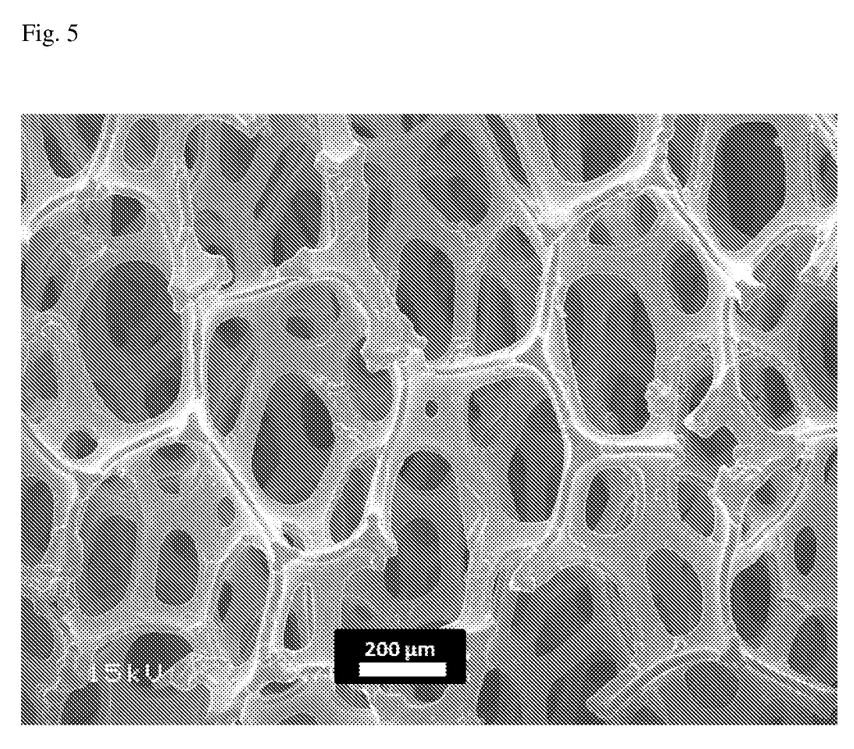
FIG. 5 shows the scanning electron microscope (SEM) image of a Nickel template. The pore size in this SEM image can be measured and compared to the pore size of the foam-like structure obtained.

A foam-like structure may be produced by a process as described above. Advantageously, the 3D foam-like structure produced according to the disclosure is sufficiently dense and robust. Hence, the pores obtained after removal of the metal template may still reflect the same pore size as provided from the metal template. In a comparative Example (Example 5 further below) the density of the 3D foam-like structure without the use of an organometallic compound was measured against the density of a 3D foam-like structure produced according to the disclosure (FIG. 3). Surprisingly, it was found that the density of the obtained foam-like structure was double as high as the density of the comparative example. As such, the density of foam-like structures according to the disclosure may be about 7 to about 15 mg cm$^{-3}$, or about 9 to about 13 mg cm$^{-3}$, or about 10 mg cm$^{-3}$. In the same comparative example, the pore diameter and total thickness of the samples were compared (FIG. 4, Example 6). The 3D foam-like structure produced without the use of an organometallic compound slightly collapsed during acid treatment and lost about 40-60% of wall thickness. In contrast, the 3D foam-like structure produced according to the disclosure resembles the metal template without loss in pore diameter and total thickness of the sample, which was compared with a SEM image of the pure metal template (FIG. 5).

The foam-like structure as described above may be used in electrochemistry, solar cells, filler, thermal interface material, sensing or biological applications. Electrochemical uses may be selected from the group consisting of energy storage and conversion devices, supercapacitors and lithium ion batteries.

EXAMPLES

The new growth process is based on a typical growth process of 3D foam-like materials via CVD on a metal (e.g. Ni) foam template. Example 1 describes an example utilizing the growth process as known to the person skilled in the art. Example 2 describes the process according to the disclosure.

Example 1—Typical Procedure Known in the Art

A typical growth process consists of annealing of Ni foam at 900 to 1200° C. under argon and/or $H_2$ gas, subsequently followed by the growth process whereby a precursor gas (i.e. $CH_4$, Ethanol or $C_2H_2$ for C, sublimated BN powder precursor) serves as the source for the C/BN-atoms of graphene/h-BN. After finalizing growth, the temperature is quickly cooled down to enable the Ni to release all C/BN atoms and obtain high quality 3D-C/BN. Afterwards, to remove the Ni template, the samples are first dip-coated in poly(methyl methacrylate) (PMMA) to protect the graphene/BN-layers during etching, and then immersed in HCl or $HNO_3$ solution for 5 hours to completely etch away the Ni. Lastly, after washing off the residual acid with $DI-H_2O$, the samples are annealed at 700° C. in argon and $H_2$ for 1 hour to remove the PMMA or submerged in Acetone for 1 hour.

Example 2—Process According to the Present Disclosure

Figure 1:
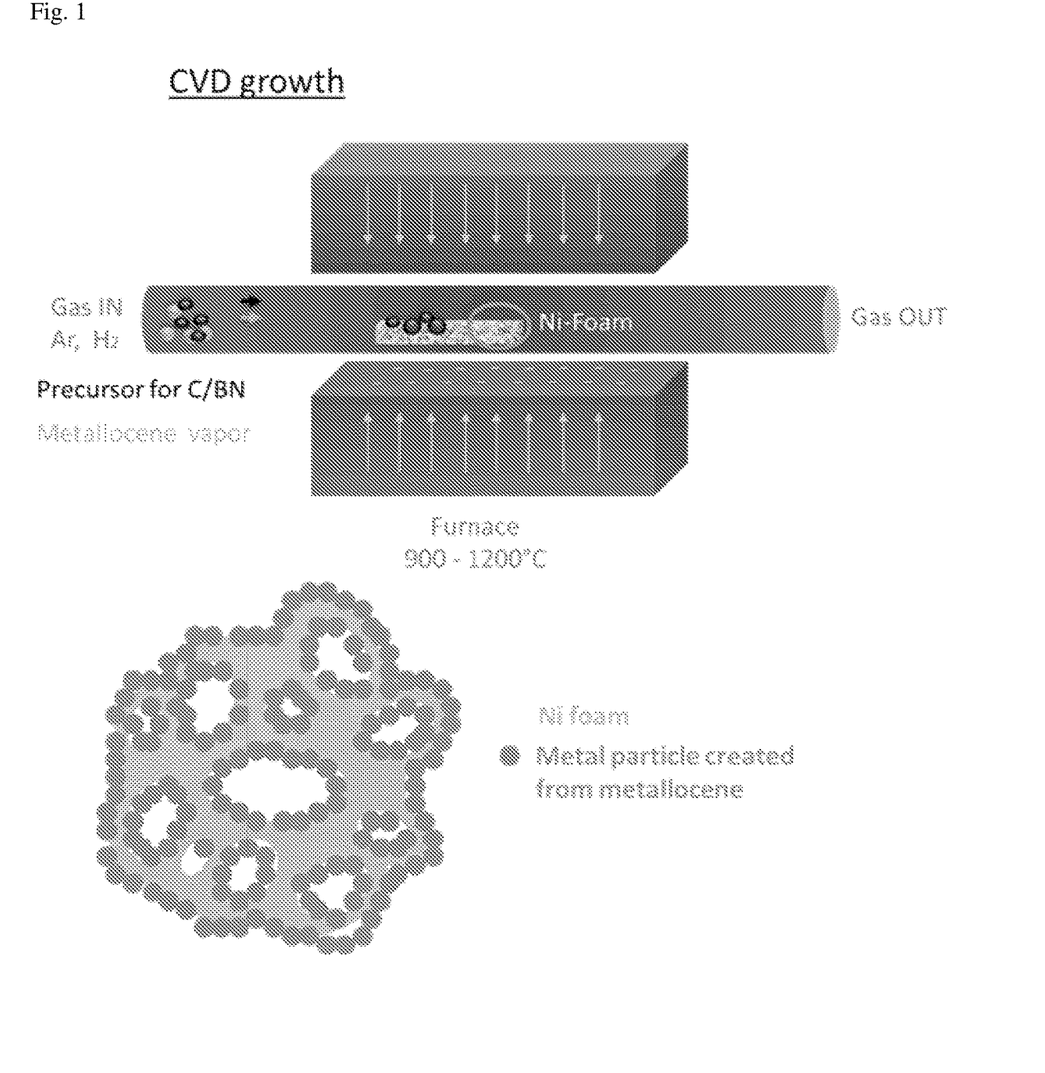
FIG. 1 discloses a specific and schematic embodiment of the metal activated vapor aided template growth process of 3D foam-like structures, with particular reference to the chemical vapor deposition process and the foam-like structure.

In this illustration, the growth process step is modified (FIG. 1), whereby besides using metal foam as a growth substrate (wherein the metal foams include but are not limited to copper and nickel), sublimated metallocene powder is simultaneously released with the precursor gas including but not limited to C or BN, to serve as a vapor-phase substrate. The sublimation of metallocene powder (pyrolysis) is carried out at the sublimation temperature stated in their data sheet (a non-limiting e.g. ferrocene at 350° C.). Upon sublimation, metallocene vapor is generated, which then is directly carried by the stream of Ar and/or $H_2$ to the 900 to 1200° C. hot-zone of the furnace, whereby decomposition of the metallocene into metallic particles occurs upon reaching this hot zone. Metallocenes have been shown to be a good precursor for producing metal catalyst particles, and it was shown that these metal particles can seed nanotube growth. In this disclosure, since the precursor source for C/BN flows in concurrently with the metallocene, upon reaching the 900 to 1200° C. hot zone, the precursor decomposes and forms either graphene or h-BN domains that nucleate and grow simultaneously on both the metal foam and the produced metal particles. Since the metal particles will tend to precipitate on surfaces, the metal foam is placed throughout the 900 to 1200° C. hot zone in a way that allows trapping of the metal particles within the foams porous surface, which in turn leads to an increase in graphene/h-BN nucleation throughout its surface area (schematic foam in FIG. 1). This creates a foam with thicker walls, only limited by the supply of metal particles and precursor gas (and not by the surface area of Ni provided, which is the case for standard growth of 3D foam-like materials).

Final gas flow and amount of metallocene powder depends on dimensions of furnace and amount of metal foam used. In an alternative embodiment, instead of metallocene powder, metallocene solution may also be used, which has a lower boiling temperature.

Figure 2:
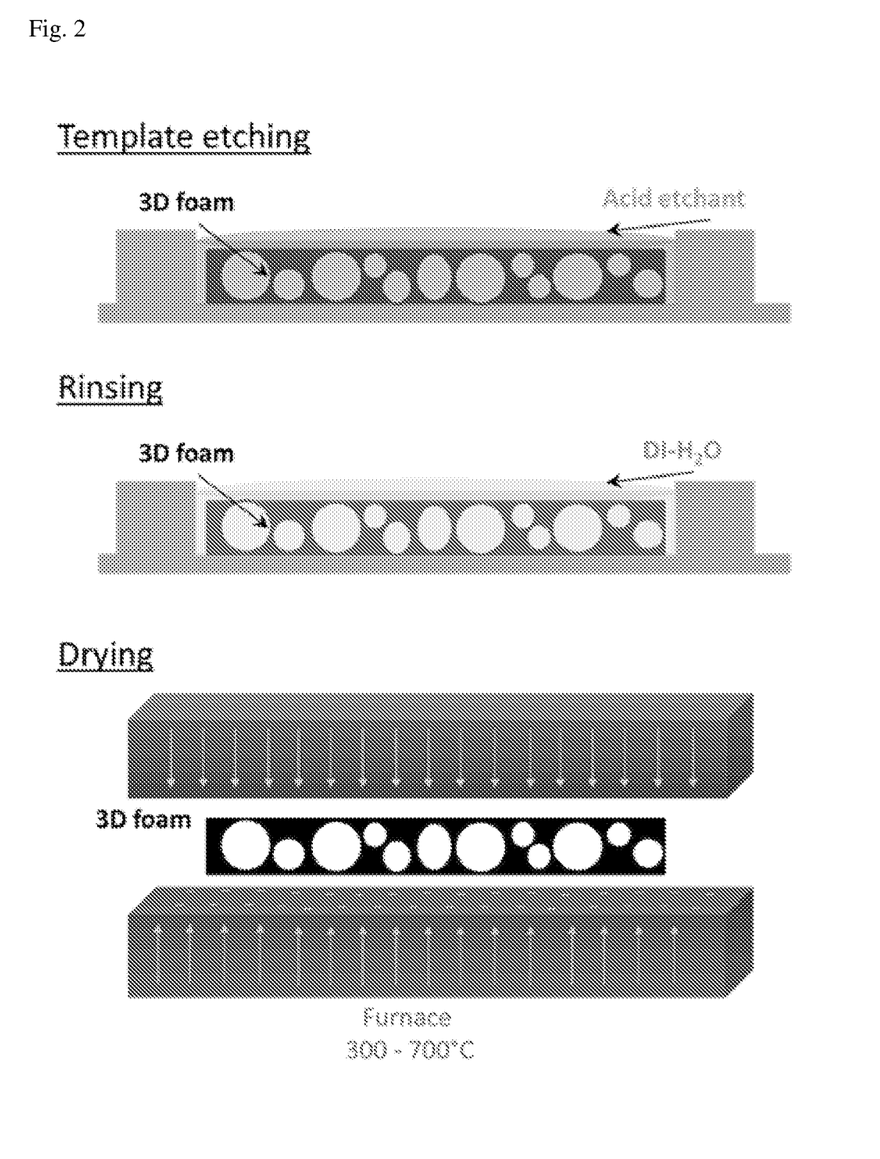
FIG. 2 discloses a specific and schematic embodiment of the metal activated vapor aided template growth process of 3D foam-like structures, with particular reference to the process steps occurring after the deposition. These include removal of the metal template ("template etching"), washing in deionized water ("rinsing") and drying to obtain a clean free-standing 3D foam-like structure.

After the growth is terminated, the metal template together with the 3D foam-like structure is cooled to room temperature. In order to remove the metal foam template, the samples can be directly submerged in acid (e.g. HCl, $HNO_3$) solution, washed in $DI-H_2O$ and dried (FIG. 2). Due to the thicker walls, the structure is more robust and withstands handling even in wet state and does not require the protective coating of a non-limiting example such as, PMMA.

Example 3—Preparation of Sample 1 (Comparative Example)

As a non-limiting demonstration, a trial run for 3D-C has been carried out. Sample 1 was produced by using the procedure detailed in Example 2, except no metallocene was present, i.e. without the use of the organometallic compound. The sample was grown for 15 minutes at a $CH_4$ flow of 20 sccm.

Example 4—Preparation of Sample 2

As a non-limiting demonstration, a trial run for 3D-C and ferrocene $Fe(C_5H_5)_2$ has been carried out. Sample 2 was produced by using the procedure detailed in Example 2, grown for 15 minutes at a $CH_4$ flow of 20 sccm. Sample 2 was grown with addition of sublimated 1 g of ferrocene.

Example 5—Change of Density of the Sample 1 and Sample 2 Obtained

The density of sample 1 and sample 2 was assessed after complete removal of the Ni template through measuring their volume and weight. Results are as follows $\rho$(Sample 1)=5 mg $cm^{-3}$
$\rho$(Sample 2)=10 mg $cm^{-3}$ While having the same growth time, the addition of ferrocene vapor enabled one to double the density of 3D-C. With the addition of more ferrocene vapor, higher densities are achievable.

FIG. 3 shows optical images of the resulting structures after removal of Ni template.

Example 6—Change of Wall-Thickness of Sample 1 and Sample 2

The same samples from Examples 3 and 4 were observed under scanning electron microscope (SEM) to observe the microstructure of the obtained foams. FIG. 4 shows their SEM images at two different magnifications.

The low magnification images clearly demonstrate the higher robustness of the ferrocene aided growth: while the three-dimensional structure of Sample 1 slightly collapsed during etching (seen in the squashing of the pores), Sample 2 resembles perfectly the Ni template without loss in pore diameter and total thickness of sample (original Ni thickness is of 2 mm, Sample 1 results in 1.67 mm and Sample 2 remains at 2 mm). A SEM of pure Ni foam is shown in FIG. 5 for comparison.

The second observation is the increase in thickness of the walls. From the high magnification SEM image of Sample 1 a thickness of 30-50 μm can be measured; Sample 2 has a thickness of around 80-100 μm. This result correlates with the measured density in Example 5.

Commercial Applications of the Disclosure

The porous structures of 3D foam-like materials make them attractive as the key components in electrochemical energy storage and conversion devices. Besides, their unique interconnected networked structure is a perfect pathway for electrons and phonons, which will help to improve electrical and thermal conductivity.

The applications mainly reported thus far can be grouped as follows:

Supercapacitors

Porous graphene and graphene-based hybrids have become the focus of research on electrode materials for supercapacitors, since their highly open porous structure allows electrolytes access to a higher surface area, which in turn offers a higher storage capacity.

Lithium Ion Batteries

Graphene materials with 3D macro-porous structures are favorable electrode candidates for lithium ion batteries as they render a highly increased surface area. This high surface area offers (same as for supercapacitors) an increase in lithium storage capacity.

Sensing

The increase in surface area not only enables a higher storage capacity, it also renders an increased active area for sensing applications. This enables higher sensitivities and faster responses.

Solar Cells

Graphene 3D macroporous structures have been reported to have an excellent performance as counter electrodes in solar cells (and especially in dye-sensitized solar cells, DSSC) due to its large surface area, good surface hydrophilicity, and well-defined porosity for enhanced electrolyte-electrode interaction and electrolyte-reactant diffusion.

Filler for Polymers

The pathway pre-determined by the interconnected structure of 3D-C/BN/BNC serves as a superior filler material since typical issues of agglomeration or bundling won't occur.

Thermal Interface Material (TIM)

Another advantage of the interconnected structure is the improved thermal transport. This can be exploited for superior thermal management.

Biological Applications

3D-C's controllable morphology is beneficial for using as a template for tissue engineering and cell culturing.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

REFERENCES

1. Chen, Z., et al., *Three-dimensional flexible and conductive interconnected graphene networks grown by chemical vapour deposition*. Nat Mater, 2011. 10(6): p. 424-428.
2. Pettes, M. T., et al., *Thermal transport in three-dimensional foam architectures of few-layer graphene and ultrathin graphite*. Nano Letters, 2012. 12(6): p. 2959-2964.
3. Zhou, M., et al., *Highly conductive porous graphene/ceramic composites for heat transfer and thermal energy storage*. Advanced Functional Materials, 2013. 23(18): p. 2263-2269.
4. Chen, Z., et al., *Lightweight and Flexible Graphene Foam Composites for High-Performance Electromagnetic Interference Shielding*. Advanced Materials, 2013. 25(9): p. 1296-1300.
5. Cao, X., et al., *Preparation of Novel 3D Graphene Networks for Supercapacitor Applications*. Small, 2011. 7(22): p. 3163-3168.
6. Yin, J., et al., *Ultralight Three-Dimensional Boron Nitride Foam with Ultralow Permittivity and Superelasticity*. Nano Letters, 2013. 13(7): p. 3232-3236.
7. Loeblein, M., et al., *Configurable Three-Dimensional Boron Nitride-Carbon Architecture and Its Tunable Electronic Behavior with Stable Thermal Performances*. Small, 2014. 10(15): p. 2992-2999.
8. Han, S., et al., *Porous Graphene Materials for Advanced Electrochemical Energy Storage and Conversion Devices*. Advanced Materials, 2013: p. n/a-n/a.
9. Rouquerol, J., et al., *Recommendations for the characterization of porous solids (Technical Report)*. Pure and Applied Chemistry, 1994. 66(8): p. 1739-1758.
10. Zu, S.-Z. and B.-H. Han, *Aqueous dispersion of graphene sheets stabilized by pluronic copolymers: formation of supramolecular hydrogel*. The Journal of Physical Chemistry C, 2009. 113(31): p. 13651-13657.
11. Zettl, A. K., et al., *Crystalline boron nitride aerogels*. 2014, Google Patents.
12. Xu, Y., et al., *Three-Dimensional Self-Assembly of Graphene Oxide and DNA into Multifunctional Hydrogels*. ACS Nano, 2010. 4(12): p. 7358-7362.
13. Huang, C., et al., *A graphene oxide/hemoglobin composite hydrogel for enzymatic catalysis in organic solvents*. Chemical Communications, 2011. 47(17): p. 4962-4964.
14. Sui, Z., et al., *Easy and green synthesis of reduced graphite oxide-based hydrogels*. Carbon, 2011. 49(13): p. 4314-4321.
15. Gutiérrez, M. C., et al., *Poly (vinyl alcohol) scaffolds with tailored morphologies for drug delivery and controlled release*. Advanced Functional Materials, 2007. 17(17): p. 3505-3513.
16. Gutiérrez, M. C., M. L. Ferrer, and F. del Monte, *Ice-Templated Materials: Sophisticated Structures Exhibiting Enhanced Functionalities Obtained after Unidirectional Freezing and Ice-Segregation-Induced Self-Assembly †*. Chemistry of Materials, 2008. 20(3): p. 634-648.
17. Vickery, J. L., A. J. Patil, and S. Mann, *Fabrication of Graphene-Polymer Nanocomposites With Higher-Order Three-Dimensional Architectures*. Advanced Materials, 2009. 21(21): p. 2180-2184.
18. Xia, X., et al., *Three-dimensional porous nano-Ni/Co (OH) 2 nanoflake composite film: a pseudocapacitive material with superior performance*. The Journal of Physical Chemistry C, 2011. 115(45): p. 22662-22668.
19. Choi, B. G., et al., *3D macroporous graphene frameworks for supercapacitors with high energy and power densities*. ACS nano, 2012. 6(5): p. 4020-4028.
20. Sun, L., et al., *From coconut shell to porous graphene-like nanosheets for high-power supercapacitors*. Journal of Materials Chemistry A, 2013. 1(21): p. 6462-6470.
21. Dong, X.-C., et al., *3D Graphene-Cobalt Oxide Electrode for High-Performance Supercapacitor and Enzymeless Glucose Detection*. ACS Nano, 2012. 6(4): p. 3206-3213.
22. Maiyalagan, T., et al., *Electrodeposited Pt on three-dimensional interconnected graphene as a free-standing electrode for fuel cell application*. Journal of Materials Chemistry, 2012. 22(12): p. 5286-5290.
23. Song, Y., et al., *Ultralight boron nitride aerogels via template-assisted chemical vapor deposition*. Sci. Rep., 2015. 5.
24. Worsley, M. A., et al., *Synthesis of graphene aerogel with high electrical conductivity*. Journal of the American Chemical Society, 2010. 132(40): p. 14067-14069.
25. Wu, D., et al., *Nanocomposites and macroscopic materials: assembly of chemically modified graphene sheets*. Chemical Society Reviews, 2012. 41(18): p. 6160-6177.
26. Zhang, L., et al., *Porous 3D graphene-based bulk materials with exceptional high surface area and excellent conductivity for supercapacitors*. Scientific reports, 2013. 3.
27. Chen, W. and L. Yan, *In situ self-assembly of mild chemical reduction graphene for three-dimensional architectures*. Nanoscale, 2011. 3(8): p. 3132-3137.
28. Niu, Z., et al., *A leavening strategy to prepare reduced graphene oxide foams*. Advanced Materials, 2012. 24(30): p. 4144-4150.
29. Lei, W., et al., *Porous boron nitride nanosheets for effective water cleaning*. Nat Commun, 2013. 4: p. 1777.
30. Wang, X., et al., *Three-dimensional strutted graphene grown by substrate free sugar blowing for high-power-density supercapacitors*. Nature communications, 2013. 4.
31. Cao, F., et al., *Fabrication and characterization of boron nitride bulk foam from borazine*. Materials & Design, 2014. 54(0): p. 610-615.
32. Loeblein, M., et al., *3D Graphene-Infused Polyimide with Enhanced Electrothermal Performance for Long-Term Flexible Space Applications*. Small, 2015: p. n/a-n/a.
33. Sen, R., A. Govindaraj, and C. Rao, *Carbon nanotubes by the metallocene route*. Chemical Physics Letters, 1997. 267(3): p. 276-280.

34. Satishkumar, B., A. Govindaraj, and C. Rao, *Bundles of aligned carbon nanotubes obtained by the pyrolysis of ferrocene-hydrocarbon mixtures: role of the metal nanoparticles produced in situ.* Chemical Physics Letters, 1999. 307(3): p. 158-162.
35. Andrews, R., et al., *Continuous production of aligned carbon nanotubes: a step closer to commercial realization.* Chemical physics letters, 1999. 303(5): p. 467-474.
36. Lee, Y. T., et al., *Temperature-dependent growth of carbon nanotubes by pyrolysis of ferrocene and acetylene in the range between 700 and 1000 C.* Chemical physics letters, 2003. 372(5): p. 853-859.
37. Kim, M. J., et al., *Double-walled boron nitride nanotubes grown by floating catalyst chemical vapor deposition.* Nano letters, 2008. 8(10): p. 3298-3302.
38. Sakhavand, N. and R. Shahsavari, *Dimensional Crossover of Thermal Transport in Hybrid Boron Nitride Nanostructures.* ACS Applied Materials & Interfaces, 2015. 7(33): p. 18312-18319.
39. Wu, Z. S., et al., *Three-Dimensional Nitrogen and Boron Co-doped Graphene for High-Performance All-Solid-State Supercapacitors.* Advanced Materials, 2012. 24(37): p. 5130-5135.
40. Maiti, U. N., et al., *Three-Dimensional Shape Engineered, Interfacial Gelation of Reduced Graphene Oxide for High Rate, Large Capacity Supercapacitors.* Advanced Materials, 2014. 26(4): p. 615-619.
41. Wang, W., et al., *Three dimensional few layer graphene and carbon nanotube foam architectures for high fidelity supercapacitors.* Nano Energy, 2013. 2(2): p. 294-303.
42. Li, X., et al., *Synthesis of 3D hierarchical Fe3O4/graphene composites with high lithium storage capacity and for controlled drug delivery.* The Journal of Physical Chemistry C, 2011. 115(44): p. 21567-21573.
43. Xiao, L., et al., *Self-Assembled $Fe_2O_3$/Graphene Aerogel with High Lithium Storage Performance.* ACS applied materials & interfaces, 2013. 5(9): p. 3764-3769.
44. Wu, Z.-S., et al., *Three-dimensional graphene-based macro-and mesoporous frameworks for high-performance electrochemical capacitive energy storage.* Journal of the American Chemical Society, 2012. 134(48): p. 19532-19535.
45. Dong, X., et al., *3D Graphene Foam as a Monolithic and Macroporous Carbon Electrode for Electrochemical Sensing.* ACS Applied Materials & Interfaces, 2012. 4(6): p. 3129-3133.
46. Kuang, J., et al., *A hierarchically structured graphene foam and its potential as a large-scale strain-gauge sensor.* Nanoscale, 2013. 5(24): p. 12171-12177.
47. Yavari, F., et al., *High Sensitivity Gas Detection Using a Macroscopic Three-Dimensional Graphene Foam Network.* Sci. Rep., 2011. 1.
48. Xue, Y., et al., *Nitrogen-Doped Graphene Foams as Metal-Free Counter Electrodes in High-Performance Dye-Sensitized Solar Cells.* Angewandte Chemie International Edition, 2012. 51(48): p. 12124-12127.
49. Bi, H., et al., *Large-scale preparation of highly conductive three dimensional graphene and its applications in CdTe solar cells.* Journal of Materials Chemistry, 2011. 21(43): p. 17366-17370.
50. Lee, J.-S., et al., *Three-dimensional nano foam of few-layer graphene grown by CVD for DSSC.* Physical Chemistry Chemical Physics, 2012. 14(22): p. 7938-7943.
51. Roy-Mayhew, J. D. and I. A. Aksay, *Graphene Materials and Their Use in Dye-Sensitized Solar Cells.* Chemical Reviews, 2014.
52. Tang, B., et al., *Three-dimensional graphene network assisted high performance dye sensitized solar cells.* Journal of Power Sources, 2013. 234(0): p. 60-68.
53. Wang, H., et al., *3D Honeycomb-Like Structured Graphene and Its High Efficiency as a Counter-Electrode Catalyst for Dye-Sensitized Solar Cells.* Angewandte Chemie, 2013. 125(35): p. 9380-9384.
54. Jia, J., et al., *Exceptional Electrical Conductivity and Fracture Resistance of 3D Interconnected Graphene Foam/Epoxy Composites.* ACS Nano, 2014.
55. Zhang, X., et al., *Exceptional thermal interface properties of a three-dimensional graphene foam.* Carbon, (0).
56. Crowder, S. W., et al., *Three-dimensional graphene foams promote osteogenic differentiation of human mesenchymal stem cells.* Nanoscale, 2013. 5(10): p. 4171-4176.
57. Li, N., et al., *Three-dimensional graphene foam as a biocompatible and conductive scaffold for neural stem cells.* Scientific reports, 2013. 3.
58. Nieto, A., et al., *Three Dimensional Graphene Foam/Polymer Hybrid as a High Strength Biocompatible Scaffold.* Advanced Functional Materials, 2015. 25(25): p. 3916-3924.
59. Song, Q., et al., *Anti-inflammatory effects of three-dimensional graphene foams cultured with microglial cells.* Biomaterials, 2014. 35(25): p. 6930-6940.
60. Wang, J. K., et al., *Polymer-enriched 3D graphene foams for biomedical applications.* ACS applied materials & interfaces, 2015. 7(15): p. 8275-8283.

The invention claimed is:

1. A chemical vapor deposition process comprising:
heating a porous metal template at a temperature range of 500 to 2000° C.; and
passing a gas mixture comprising a carrier gas carrying along a vapor of an organometallic compound and at least one of a carbon precursor gas and a boron nitride precursor gas through the heated metal template,
wherein the heating temperature causes the decomposition of the organometallic compound vapor into metal particles, the carbon precursor gas into graphene domains, and/or the boron nitride precursor gas into hexagonal-boron nitride domains,
wherein the metal particles are deposited on the surface and within the pores of the metal template,
wherein the graphene domains and/or the hexagonal-boron nitride domains nucleate and grow on the metal particles and on and within the metal template to form a three-dimensional interconnected porous network of graphene and/or hexagonal-boron nitride, and
wherein the three-dimensional interconnected porous network of graphene and/or hexagonal-boron nitride comprises walls having a thickness of around 80 µm to 100 µm.

2. The process of claim 1, wherein the metal template is macroporous.

3. The process of claim 1, wherein the metal template comprises nickel or copper.

4. The process of claim 1, wherein the organometallic compound comprises a metallocene.

5. The process of claim 4, wherein the metallocene is selected from the group consisting of ferrocene, nickelocene, cobaltocene, ruthenocene, chromocene and osmocene.

6. The process of claim 4, wherein the vapor of the metallocene is formed by the sublimation of the metallocene in powder form.

7. The process of claim 4, wherein the vapor of the metallocene is formed by the boiling of the metallocene in solution form.

8. The process of claim 1, wherein the metal particles accelerate the nucleation and growth of the graphene domains and/or the hexagonal-boron nitride domains.

9. The process of claim 1, wherein the carbon precursor gas comprises an alkane, alkene or alcohol, up to a carbon chain of 4 carbon atoms.

10. The process of claim 1, further comprising removing the metal template from the three-dimensional interconnected porous network of graphene and/or hexagonal-boron nitride.

11. The process of claim 10, wherein the metal template is removed by contacting with an acid.

12. The process of claim 1, wherein the carrier gas carries along a vapor of an organometallic compound and at least one of a carbon precursor gas and a boron nitride precursor gas into a chemical vapor deposition chamber prior to passing the gas mixture through the heated metal template.

* * * * *